US010116393B2

(12) United States Patent
Nagarajan et al.

(10) Patent No.: US 10,116,393 B2
(45) Date of Patent: *Oct. 30, 2018

(54) DRIVER MODULE FOR MACH ZEHNDER MODULATOR

(71) Applicant: INPHI CORPORATION, Santa Clara, CA (US)

(72) Inventors: Radhakrishnan L. Nagarajan, Santa Clara, CA (US); Todd Rope, Glendale, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/976,659

(22) Filed: May 10, 2018

(65) Prior Publication Data

US 2018/0262273 A1    Sep. 13, 2018

Related U.S. Application Data (63) Continuation of application No. 15/832,296, filed on Dec. 5, 2017, now Pat. No. 9,998,231, which is a
(Continued)

(51) Int. Cl.
| | |
|---|---|
| *H04B 10/00* | (2013.01) |
| *H04B 10/524* | (2013.01) |
| *G02F 1/225* | (2006.01) |
| *H03M 1/68* | (2006.01) |
| *G02F 1/01* | (2006.01) |
| *G02F 1/21* | (2006.01) |

(52) U.S. Cl.
CPC ......... *H04B 10/524* (2013.01); *G02F 1/0123* (2013.01); *G02F 1/2257* (2013.01); *H03M 1/682* (2013.01); *G02F 2001/212* (2013.01)

(58) Field of Classification Search
CPC ... H04B 10/524; G02F 1/0123; G02F 1/2257; G02F 2001/212; H03M 1/682
USPC ........................................................ 398/189
See application file for complete search history.

(56) References Cited

U.S. PATENT DOCUMENTS

| | | | | |
|---|---|---|---|---|
| 4,257,111 A | * | 3/1981 | Soohoo ................ | G11C 27/04 365/114 |
| 9,838,131 B1 | * | 12/2017 | Voois ..................... | H04B 10/58 |

(Continued)

*Primary Examiner* — Tesfaldet Bocure
(74) *Attorney, Agent, or Firm* — Richard T. Ogawa; Ogawa P.C.

(57) ABSTRACT

A single chip dual-channel driver for two independent traveling wave modulators. The driver includes two differential pairs inputs per channel respectively configured to receive two digital differential pair signals. The driver further includes a two-bit DAC per channel coupled to the two differential pairs inputs to produce a single analog differential pair PAM signal at a differential pair output for driving a traveling wave modulator. Additionally, the driver includes a control block having internal voltage/current signal generators respective coupled to each input and the 2-bit DAC for providing a bias voltage, a tail current, a dither signal to assist modulation control per channel. Furthermore, the driver includes an internal I2C communication block coupled to a high-speed clock generator to generate control signals to the control block and coupled to host via an I2C digital communication interface.

20 Claims, 5 Drawing Sheets

Related U.S. Application Data continuation of application No. 15/481,920, filed on Apr. 7, 2017, now Pat. No. 9,876,579, which is a continuation of application No. 15/406,273, filed on Jan. 13, 2017, now Pat. No. 9,654,221, which is a continuation of application No. 14/798,322, filed on Jul. 13, 2015, now Pat. No. 9,553,673.

(56) References Cited

U.S. PATENT DOCUMENTS

| | | | |
|---|---|---|---|
| 2005/0068600 A1* | 3/2005 | Ogura | G02F 1/0123 359/238 |
| 2007/0014509 A1* | 1/2007 | Kish, Jr. | B82Y 20/00 385/14 |
| 2015/0280831 A1* | 10/2015 | Noguchi | H04B 10/5051 398/188 |

* cited by examiner

DRIVER MODULE FOR MACH ZEHNDER MODULATOR

CROSS-REFERENCE TO RELATED APPLICATIONS

This application is a continuation of and claims priority to U.S. patent application Ser. No. 15/832,296, filed Dec. 5, 2017, now issued as U.S. Pat. No. 9,998,231, issued Jun. 12, 2019 which is a continuation of U.S. patent application Ser. No. 15/481,920, filed Apr. 7, 2017, now U.S. Pat. No. 9,876,579 issued Jan. 23, 2018, which is a continuation of U.S. patent application Ser. No. 15/406,273, filed Jan. 13, 2017, now U.S. Pat. No. 9,654,221 issued May 16, 2017, which is a continuation of U.S. patent application Ser. No. 14/798,322, filed Jul. 13, 2015, now U.S. Pat. No. 9,553,673 issued Jan. 24, 2017, commonly assigned and incorporated by reference herein for all purposes.

BACKGROUND OF THE INVENTION

The present invention relates to telecommunication techniques. More particularly, the present invention provides a two or more channel PAM4 modulator driver for silicon photonics modulator based high-rate (100G or greater) optical data transmission, though other applications are possible.

Over the last few decades, the use of communication networks exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

Progress in computer technology (and the continuation of Moore's Law) is becoming increasingly dependent on faster data transfer between and within microchips. Optical interconnects may provide a way forward, and silicon photonics may prove particularly useful, once integrated on the standard silicon chips. 40-Gbit/s and then 100-Gbit/s data rates DWDM optical transmission over existing single-mode fiber is a target for the next generation of fiber-optic communication networks. Everything is okay up to 10 Gbits/s, but beyond that, distortion and dispersion take their toll. Many approaches are proposed on modulation methods for transmitting two or more bits per symbol so that higher communication rates can be achieved. Mach-Zehnder modulators (MZM) can handle the higher data rates but require a driver that is differential with a large output voltage swing.

In the past, there have been many types of light modulation drivers and associated modulation techniques. Unfortunately, they have been inadequate in driving two independent channels of impedance matched traveling wave modulator with multi-level signals based on two-level NRZ digital inputs received from a transmitter ASIC for various applications in silicon photonics based data transmission. Therefore, improved drivers with advanced features are desired.

BRIEF SUMMARY OF THE INVENTION

The present invention relates to telecommunication techniques. More particularly, the present invention provides a dual-channel PAM4 Mach Zehnder modulator driver for a silicon photonics based high-rate (100G or greater) WDM optical data transmission, though other applications are possible.

In modern electrical interconnect systems serial links have replaced parallel data buses, and serial link speed is rapidly increasing due to the evolution of CMOS technology. Internet bandwidth doubles almost every two years following Moore's Law. But Moore's Law is coming to an end in the next decade. Standard CMOS silicon transistors will stop scaling around 5 nm. And the internet bandwidth increasing due to process scaling will plateau. But Internet and mobile applications continuously demand a huge amount of bandwidth for transferring photo, video, music, and other multimedia files. This disclosure describes techniques and methods to improve the communication bandwidth beyond Moore's law.

Serial link performance is limited by the channel electrical bandwidth and the electronic components. 40G or 100G optical networking technology began deployment with client side using 40G VSR to interface with routers and line side using 40G or higher DWDM system to increase backbone network capacity with reach beyond 1000 km. The 40G or higher DWDM requires external Mach-Zehnder modulators and drivers that have best features coming out of a tradeoff between drive voltage and high bandwidth of the driver materials used. Differential driving technology disclosed in this application provides a preferred driver in small die form with wider output voltage swing, more flexible independent channel control, automatic tone generation, and better reliability for applications in transceivers that will reach the 40- and 100-Gbit/s targets.

In a specific embodiment, the present invention provides a single chip dual-channel driver for two independent traveling wave modulators. The driver includes two differential pairs of inputs per channel respectively configured to receive two digital differential pair signals. Additionally, the driver includes a two-bit Digital-to-Analog Convertor (DAC) per channel coupled to the two differential pairs of inputs to convert the two digital differential pair signals to a single analog differential pair PAM signal. The single analog differential pair PAM signal at a differential pair output comprises two single-end swing voltages respectively outputted to two near ends of two waveguides of a traveling wave modulator associated with the channel and terminated at corresponding two far ends with a pair of matched resistors. Furthermore, the driver includes a control block having internal voltage/current signal generators, a tail current control, a dither signal to assist modulation control per channel. Moreover, the driver includes an I2C communication block coupled to a high-speed clock generator to generate control signals to the control block and coupled to host via an I2C digital communication interface.

In general, the present invention provides a multi-channel digital-to-analog (DAC) driver for optical signal modulation in many high data-rate communication applications and beyond. The present invention achieves these benefits and others in the context of known optical technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present invention relates to telecommunication techniques. More particularly, the present invention provides a dual-channel PAM4 driver for Mach Zehnder traveling wave modulator in silicon photonics based high-rate (100G or greater) optical data transmission, though other applications are possible.

In the last decades, with advent of cloud computing and data center, the needs for network servers have evolved. For example, the multiple-level switch/router configuration that have been used for a long time is no longer adequate or suitable, as distributed applications require flatter network architectures, where server virtualization that allows servers to operate in parallel. For example, multiple servers can be used together to perform a requested task. For multiple servers to work in parallel, it is often imperative for them to be share large amount of information among themselves quickly, as opposed to having data going back forth through multiple layers of network architecture (e.g., network switches, etc.).

Leaf-spine type of network architecture is provided to better allow servers to work in parallel and move data quickly among servers, offering high bandwidth and low latencies. Typically, a leaf-spine network architecture uses a top-of-rack switch that can directly access into server nodes and links back to a set of non-blocking spine switches that have enough bandwidth to allow for clusters of servers to be linked to one another and share large amount of data.

In a typical leaf-spine network today, gigabits of data are shared among servers. In certain network architectures, network servers on the same level have certain peer links for data sharing. Unfortunately, the bandwidth for this type of set up is often inadequate. It is to be appreciated that embodiments of the present invention utilizes PAM (e.g., PAM4, PAM8, PAM12, PAM16, etc.) in leaf-spine architecture that allows large amount (up terabytes of data at the spine level) of data to be transferred via optical network.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 1:
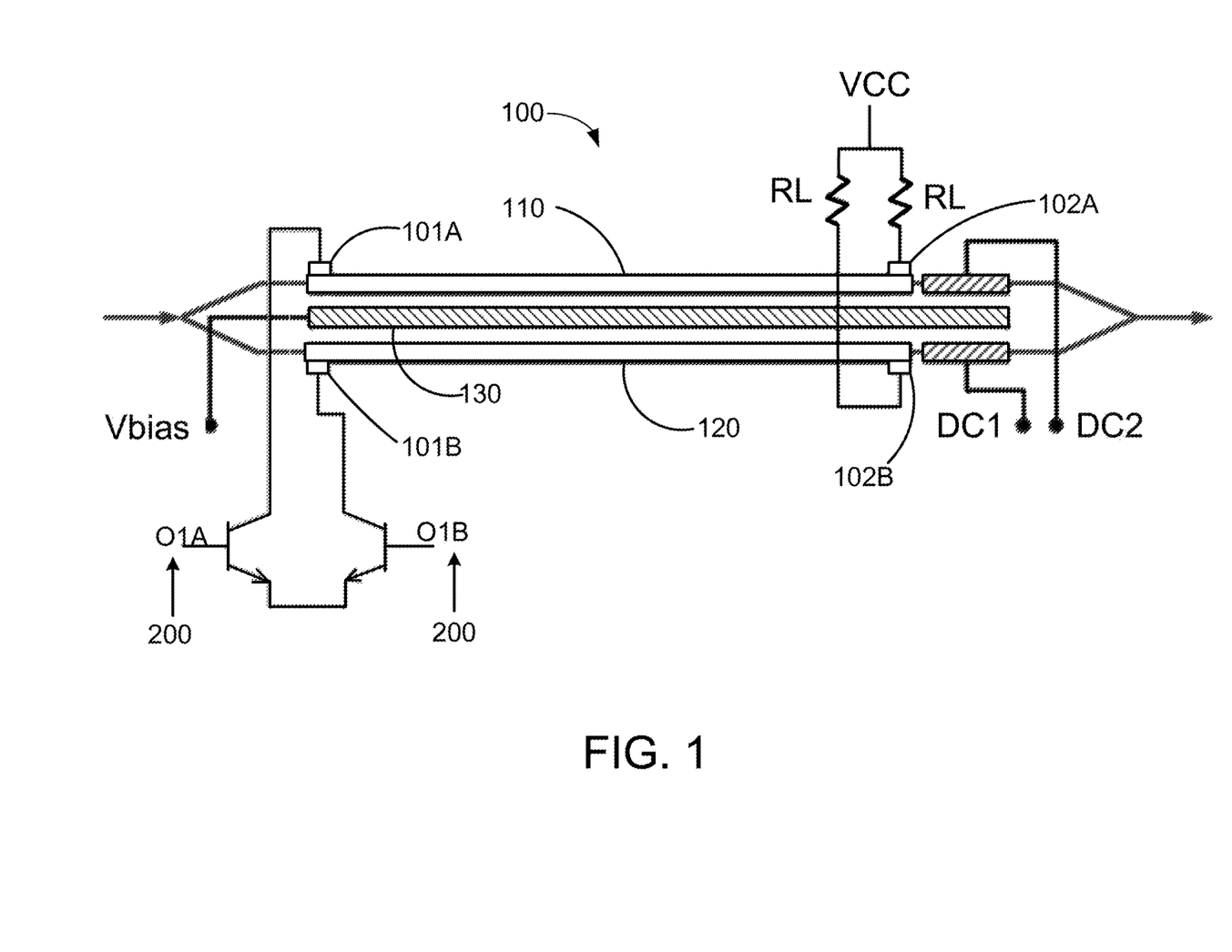
FIG. 1 is a simplified diagram of a driver for an impedance matched Mach-Zehnder traveling wave modulator according to an embodiment of the present invention.

FIG. 1 is a simplified diagram of a driver for an impedance matched Mach-Zehnder traveling wave modulator according to an embodiment of the present invention. This diagram is merely an example, which should not unduly limit the scope of the claims. One of ordinary skill in the art would recognize many variations, alternatives, and modifications. As shown, the Mach Zehnder modulator 100 is a traveling wave modulator made using silicon with standard CMOS technology. The modulator 100 includes two linear waveguides 110 and 120 configured to receive an optical wave at an input port 10 and output a modulated optical wave at an output port 20. A middle electrode 130 made in silicon-based material is in parallel to the two linear waveguides 110 and 120. A driver circuit 200 (to be shown in FIG. 2 below) has two output ports O1A and O1B wire bonded respectively to (p-n) two electrodes 101A and 101B at near end of the two waveguides 110 and 120 of the modulator 100. A bias voltage Vbias is generated internally by the driver 200 and is applied to the middle electrode 130 of the modulator 100. Each of two far end electrodes 102A and 102B of the waveguides 110 and 120 is terminated on-modulator to a matched resistor of termination resistance RL which is coupled to a VCC (typically 3.3V) voltage from a nominal positive power supply. Additionally, two separate DC bias voltages DC1 and DC2 can be respectively applied to the two linear waveguides 110 and 120 for phase adjustment of the modulated optical wave outputted to the port 20.

In a specific embodiment, the circuit layout assumes that the driver 200 is wire bonded to the modulator 100 (at the near end 101A and 101B) with a 1 mil diameter wire. The far end 102A or 102B is terminated on-modulator to a matched resistor (termination resistance RL). The final length of the near-end wire bond depends on the driver channel pitch, modulator channel pitch and the proximity placement of the driver 200 to the modulator 100. The length of the wire bond will be between 0.2 mm and 1.0 mm.

Figure 2:
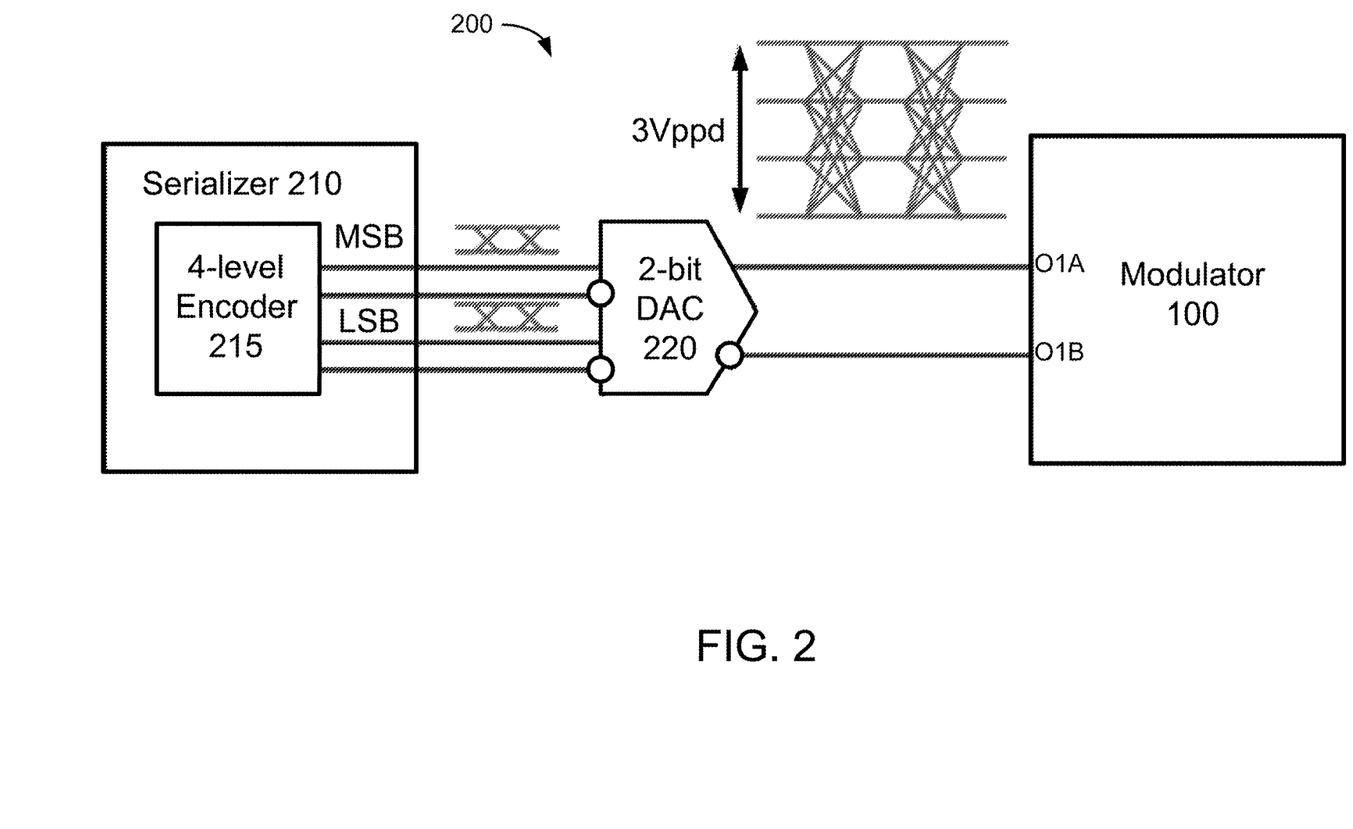
FIG. 2 is a schematic diagram of a 4-level 2 bit DAC-based limiting driver for a Mach-Zehnder traveling wave modulator according to an embodiment of the present invention.

FIG. 2 is a functional diagram of a 4-level 2 bit DAC-based limiting driver for a Mach-Zehnder modulator according to an embodiment of the present invention. This diagram is merely an example, which should not unduly limit the scope of the claims. One of ordinary skill in the art would recognize many variations, alternatives, and modifications. As shown, the driver 200 is configured to receive digital inputs from a serializer 210 of a transmitter ASIC circuit. The digital inputs, for example, are streamed in and processed by a 4-level encoder 215 which converts two bits of digital signals in NRZ format with two symbols "1" and "0" (representing two voltage levels) into one bit MSB data stream and one bit LSB data stream with data rate up to 32 Gbps and beyond. Then the MSB data stream and the LSB data stream are fed into a 2-bit digital-to-analog converter (DAC) 220 which produces a pair of analog output signals OUTN and OUTP applied respectively to port O1A and O1B of the driver circuit 200 for driving the modulator 100. Each of the analog output signals has amplitude resolution of 8 bits to ensure low signal-to-noise ratio for handling at least the 4-level PAM4 modulation.

In a specific embodiment, each of the output signals OUTN and OUTP is able to produce a driving current in each arm (110 and 120) of the modulator 100 and generate a single-ended voltage swing, e.g., up to 1.5V. A Vbias voltage is internally generated (referenced to GND) to avoid any loss of range of the single-ended voltage swing due to lack of headroom when it is referenced to VCC of a nominal positive power supply. Combining both single-ended output swings (between VCC-1.5V and VCC), a differential output amplitude is yield with a peak-to-peak voltage of 3.0 Vppd for providing modulation in PAM4 format to the optical signal passing through the two waveguides. In an implementation, for using a termination resistor RL of mere 30Ω, the output current of the driver 200 is high enough to produce the 3 Vppd swing. The output stage is configured to control the driving current to be stabilized over temperature and operating voltage using an internal on-chip reference. The driver will be calibrated by the user to accommodate variations over process corners.

Figure 3:
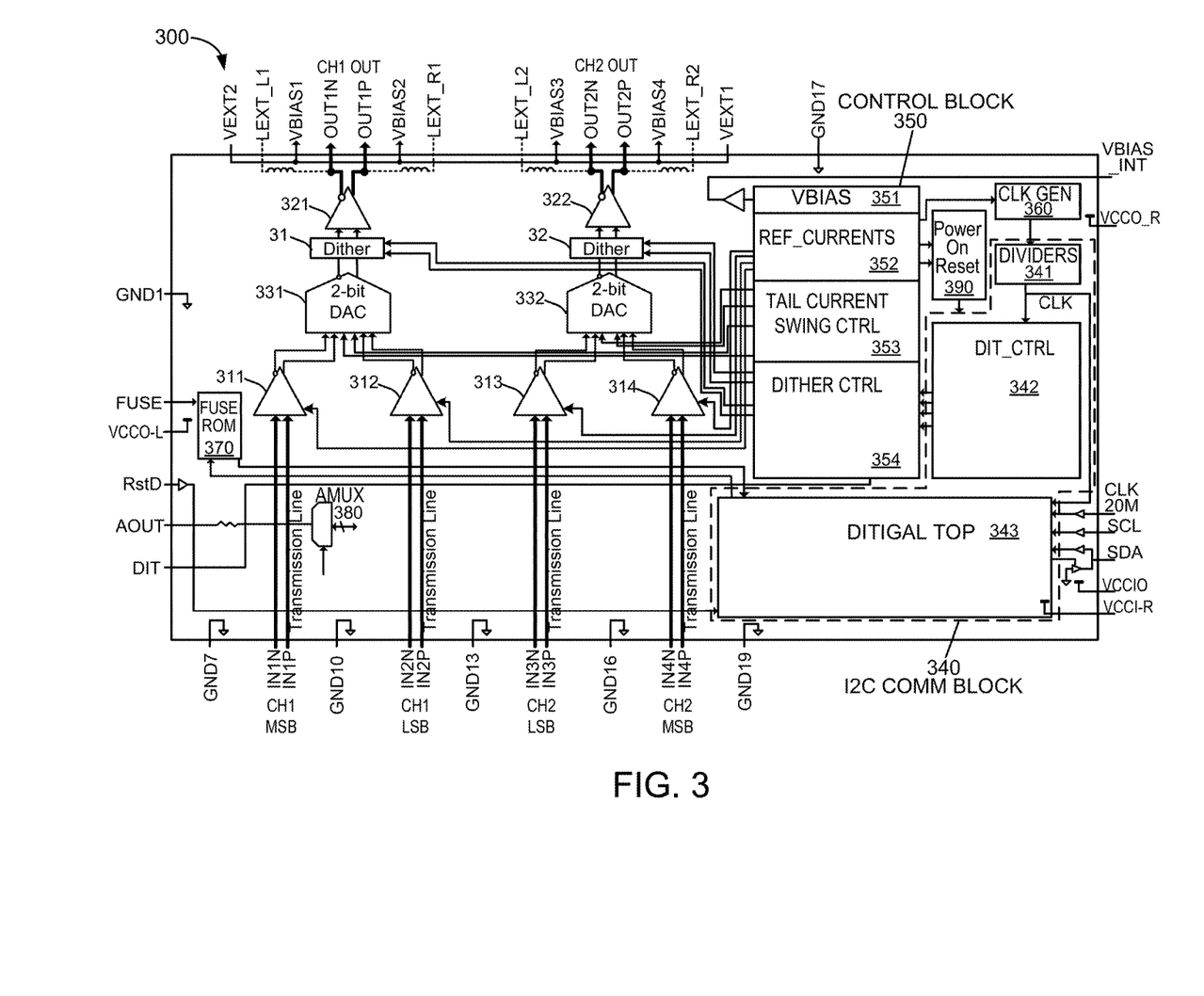
FIG. 3 is a simplified block diagram of a dual-channel PAM4 driver according to an embodiment of the present invention.

FIG. 3 is a simplified block diagram of a dual-channel PAM4 driver according to an embodiment of the present invention. This diagram is merely an example, which should not unduly limit the scope of the claims. One of ordinary skill in the art would recognize many variations, alternatives, and modifications. As shown, the dual-channel PAM4 driver 300 is laid out in a 2.55 mm×1.30 mm SiGe die pad including two channels (Ch1 and Ch2) for respectively receiving two differential pair (MSB and LSB) signals per channel and producing two differential pair outputs with all I/O and control pins being laid as pads along edges of the SiGe die. In an embodiment, each channel (Ch1 or Ch2) is conceptually configured as the driver circuit 200 shown in FIG. 2 including two first-stage amplifiers 311 and 312 (or 313 and 314) being added in the transmission lines associated with Ch1 (or Ch2) and one second-stage amplifier 321 (or 322) and one Dither 31 (or 32) being laid behind a 2-bit DAC 331 (or 332). Each first-stage amplifier is to amplify the differential pair of 1-bit MSB and 1-bit LSB digital signals received from input pins INnN and INnP (n=1, 2 for Ch1 or 3, 4 for Ch2). The 2-bit DAC 33m (m=1, 2 respectively for Ch1, Ch2) converts the two differential digital signals to one differential analog signal before yielding to output pins OUTmN and OUTmP of the corresponding channel (Ch1 or Ch2) for driving an impedance-matched Mach Zehnder modulator (100 of FIG. 1). In an example, the OUT1N pin is connected to O1A port and OUT1P pin is connected to O1B port of FIG. 1 for driving the corresponding modulator 100 associated with Ch1. Dither 31 simply is configured to add a small sinusoidal tone generated internally by the driver 300 to the driver's output at OUT1N and OUT1P. The dither signal is used subsequently to maintain the modulator bias at a desired point. Driver setup is substantially the same for another modulator associated with Ch2.

In an alternative embodiment, the present invention can be implemented in a 8-level 3-bits DAC-based driver configured to receive with digital inputs in three channels (Ch1, Ch2, Ch3) for driving an impedance-matched Mach Zehnder modulator in PAM 8 format. In general, embodiments of the present invention is applicable to a $2^n$-level n-bits DAC driver, where n=2, 3, 4 . . . , represents the number of digital inputs and $2^n$ represents the number of levels of converted final analog signal. The digital inputs in each channel includes two digital differential pair signals, each of which can be configured to be a two-level non-return-to-zero (NRZ) bit with data rate up to 32 Gbps.

Referring back to FIG. 3, the dual-channel driver 300 includes a clock generator 360, a power_on reset unit 390, and an I2C communication block 340 to control the signal input/output (I/O), signal amplification and digital-to-analog conversion. Further the dual-channel driver 300 also includes a control block 350 containing an internal driving bias generator 351, a reference current generator 352, a tail current and swing voltage generator 353, and an internal dither generator 354. The I2C communication block 340 employs an I2C digital communication interface to receive the high-speed signal from the clock generator 360 and provide control signal via DAC to the control block 350 and via a plurality pads to communicate with host. In an implementation, the I2C digital communication interface has a slave address 7'bxxxx_xxA where the eighth bit A is a R/W value on the A0 pin and xxxx_xx can be 1000_00. The I2C digital communication interface runs at fast mode compatible with 400 kHz as well as fast-plus mode at 1 MHz. In another specific embodiment, the clock generator 350 is a 6.4 GHz VCO clock configured to run at least 20 MHz so that the internal I2C sampling clock is at least 16× the I2C clock as the I2C interface runs at 1 MHz. After passing through several stages of dividers 341, the sampling clock can be reduced to a few MHz for running a DIT-CTRL sub-block 342 for generating control signals for the internal dither generator 354. Additionally, the power-on reset unit 390 is there to reset all the digital blocks of the driver 300 due to a power-on or brown-out condition.

In another specific embodiment, the I2C communication block 340 is configured to provide a variety of internal set points including output swing adjustment ratio (one per channel), a bias voltage level, dither swing voltage (one per channel), as well as cascode control and input offset adjustment. In particular, I2C communication block 340 controls the reference current generator 352 to provide bias currents respectively for four first stage amplifiers (311-314) for adjusting channel input bias voltage from default, providing directional control for the front end and offset correction required for passing the received digital MSB or LSB signals to the corresponding 2-bit DAC (331 or 332).

Further, the I2C communication block 340 controls the tail current and swing voltage generator 353 to provide output voltage swing amplitude control with maximum value set at 50 mA×RL and minimum value set at 19.5 mA×RL. Note, the swing maximum typically is set such that output stage is not pushed into saturation. The output swing adjustment ratio has a maximum value of 3 and a minimum value of 1, for setting driver's coarse output swing and slowly varying the output amplitude. A desired maximum nominal single ended output swing value is 1.5V or higher. I2C communication block 340 also controls the internal driving bias generator 351 for optionally generating a required modulator bias voltage. A same bias voltage level Vbias is to set a common bias for both modulators (associated with Ch1 and Ch2). Vbias is internally generated in a range of 0-2V by the bias generator 351. Alternatively, it can be externally supplied for Vbias<0V via VEXT pin with maximum rating of −4.0V. In one optional application of the driver 300 for certain type of modulator with enough headroom above GND for output swing, internally generated Vbias is provided by wire bonding VBIAS_INT pad to VEXT pad. In another optional application of the river 300 for certain type of modulator without enough headroom, VBIAS_INT pad will not be wire bonded to VEXT pad, instead VEXT pad is connected directly to an external voltage source to supply a negative voltage to GND so as to avoid any loss of bias range due to headroom when referenced to nominal power supply VCC.

Figure 4:
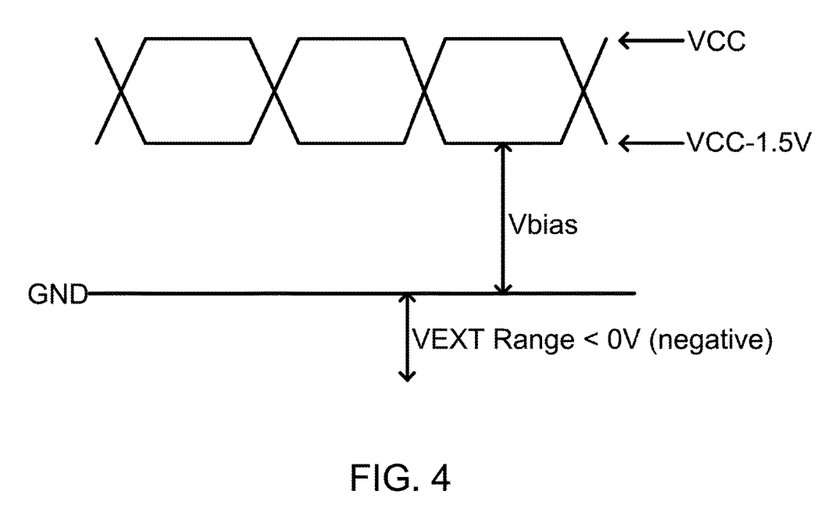
FIG. 4 is a simplified diagram illustrating operational voltages of Vbias, VEXT, GND, and Output Swing of the modulator driver according to an embodiment of the present invention.

FIG. 4 shows the relationship between Vbias and VEXT, the output swing voltage and GND according to an embodiment of the present invention. The Vbias is a positive value relative to GND and internally generated. The VEXT corresponds to a negative value and is externally supplied and wired directly to the output pins such as OUT1N and OUT1P for channel 1 (Ch1). As shown in FIG. 4, the output swing voltage is 1.5V from VCC-1.5V to VCC (VCC=3.3V is voltage from nominal power supply). The output swing needs sufficient headroom provided by the Vbias during MZ modulator control. If the headroom is not enough for supporting the output swing in certain situation, the Vbias needs to be a negative value. Coupling of the bias generator 351 to the modulator middle electrode will be cut while the externally supplied VEXT with a negative voltage is provided with a lowered baseline to increase the headroom from original baseline GND for the desired output swing.

In an embodiment, the output stage need to be steering current stabilized over temperature and operating voltage using an internal on-chip reference. The output swing control, particularly, the amplitude swing, can be finely done using a low frequency dither tone swing up to 75 mV that is generated internally or supplied externally for applying to the driver output. The dither tone source is controlled by I2C communication block 340 via a DIT_CTRL sub-block 342 to drive several DACs in the internal dither generator 354. A preference of the dither tone would be to have the low frequency sinusoidal tone generated on the driver 300 and applied to the output drive signal (at OUTmN and OUTmN pins). In addition, the driver design shall provide a DIT pin where the dither signal may be externally added for signal processing to control the modulator operating point. The internally generated dither signal, controlled by I2C interface, will be output via an AOUT pin which is an output from an analog mutiplexer AMUX 380 for drawing on-module operation information for calibration. The modulator driver 300 will be calibrated by the user to accommodate variations over process corners and environmental variations.

Figure 5:
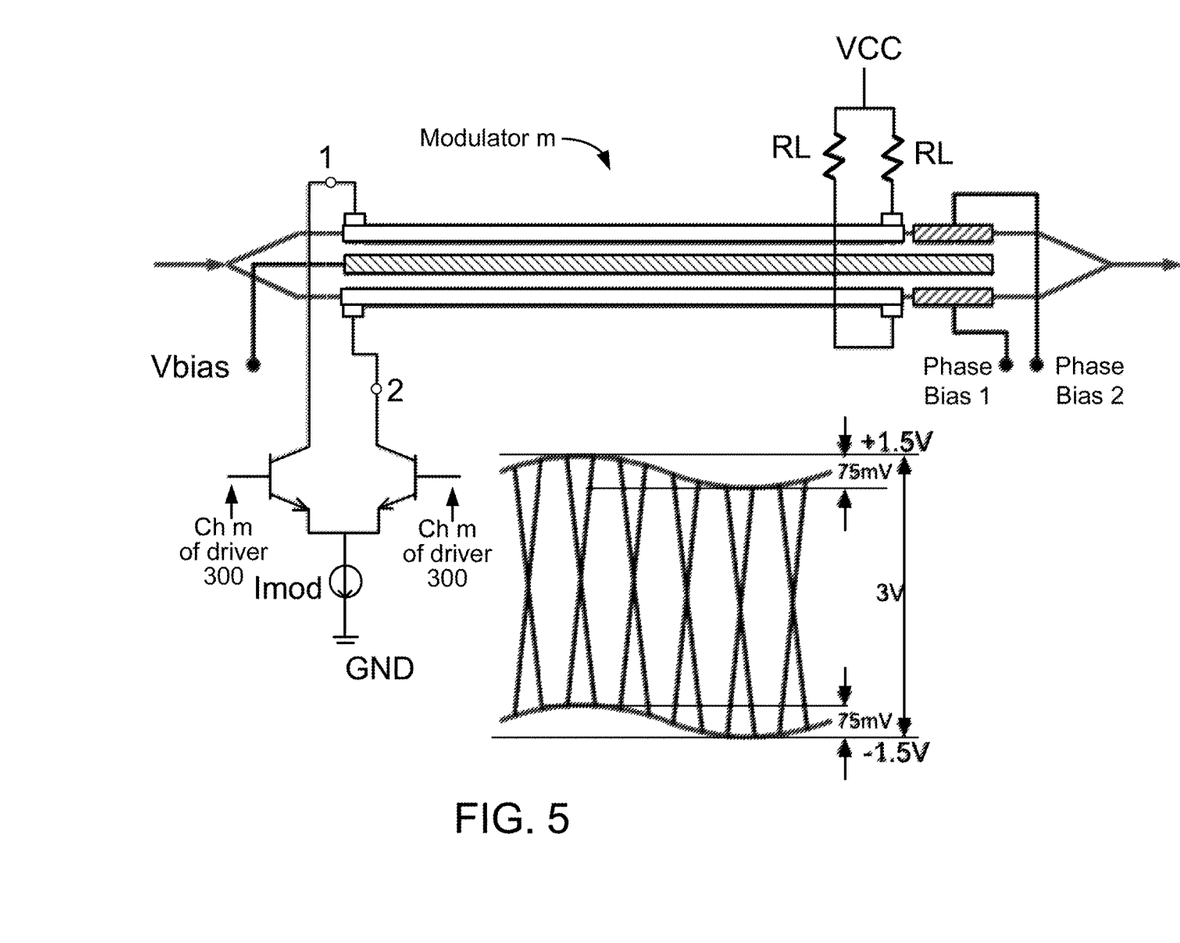
FIG. 5 is a simplified diagram illustrating dither signal applied to the modulator driver according to one or more embodiments of the present invention.

In a specific embodiment, dither tone generation may be based on a 2 DAC design, one coarse (per channel, referenced to 1.5V) and one fine (2 global options, referenced to 75 mV) and is referred to as DIT_DAC0 and DIT_DAC1 disposed in the internal dither generator 354, and a lookup table for providing the sinusoidal wave. FIG. 5 is a simplified diagram illustrating dither signal applied to the modulator driver according to one or more embodiments of the present invention. As shown, modulator m (m=1, 2) is one of two modulators driven by the dual-channel PAM4 driver 300 via differential output with bias at channel m. On one of two input lines connected respectively to two arms of the modulator m from the output lines of the driver 300, a point marked as 1 or 2 in the driver circuit is used for adding the dither tone. The choice to enable dithering and application between external and internal dither tones is controlled per channel by the I2C interface. In an example, when a first I2C DIT register (Cx_DITEN) is set to 1 indicating that a dither should be applied, a second I2C DIT register (Cx_DITCON) is set to 0 indicating that the DIT signal should be applied at point 1 or 2, and a third I2C DIT register (Cx_DITSRC) will determine where the signal should be taken from. As shown in the inset of FIG. 5, the dither signal of 75 mV is applied on top of the output swing with peak-to-peak voltage Vppd=3.0V (each single-ended swing is between VCC and VCC-1.5V).

In a specific embodiment, the look-up table for the sinusoid dither tone is specified as a quarter wave in a total of 48 steps. The dither signal will be generated for each DIT DAC in the internal dither generator 354 controlled by the I2C interface block 340 under DIT_CTRL sub-block 342. Note that the connection of the dither signal to the output channel is determined by the as-mentioned first, second, and third I2C DIT registers. The procedure includes, setting the corresponding channel's DIT DAC value to the $0^{th}$ code value, waiting for the length of time specified by a delay time register (if the DAC response time is greater than the delay time then a best effort will be made), proceeding to the next code value and repeat until the $47^{th}$ code is reached, proceeding to the previous code value and repeat reversely till $0^{th}$ code value again, when the $0^{th}$ code is reached, changing from a positive source to a negative source and starting again. Therefore, the 48 codes will represent the first rising section of a sin function. This section will be repeated in reverse to generate the 2nd (falling) section. Then the first section will be repeated again but negative for the 3rd (falling) section, finally it will be repeated in reverse but negative for the 4th (rising) section. The code value may be allowed to be adjusted via the I2C interface.

The internal dithering system can be enabled or disabled via two registers in the DIT-CTRL sub-block 342. When the internal dithering system is disabled, the external DIT signal may be used as a fine-control to the amplitude of the driver output RF signal. This is accomplished by setting the first I2C DIT register to 1, the second I2C DIT register to 1, and the third I2C DIT register to determine where the signal should be taken from.

In an alternative embodiment, the dual-channel PAM4 driver 300 also includes a fuse on die 370 to allow wafer temperature calibration. The fuse on die 370 contains temperature offset and gain calibration and will be accessible via I2C communication block 340. FUSE pin is used for efuse. The AMUX 380 output is brought to a pad on the driver 300 and digitized externally. The resistance of AOUT pin, in an implementation, is norminally 1 kΩ, which is also configured via I2C communication block 340.

In another alternative embodiment, I2C communication block 340 provides I2C interface via a register to shut down individual channels to save power. In an implementation, a SHARED_POWER_DOWN register, containing a separate bit for each channel as well as a separate bit for the chip-level analog system, is used to shut down one or more channels or the whole chip. Max power consumption of the individual channels in the shutdown state should not exceed 10 mW. Total chip power consumption with all four (digital) channels shut down should not exceed 50 mW. Referring to FIG. 3, RstD pin is a Digital reset pin assigned for executing the above function. In an implementation, RstD pin only resets the I2C state machine but not impacts DAC register settings (codes) so that the data path is not impacted by the I2C interface reset. Resetting the I2C state machine also resets one particular register which controls the VCO power-down state. When the VCO is powered down via I2C register access so that the I2C bus is no longer available, RstD pad can be toggled to recover from this. In an embodiment, an alternative device register reset mechanism can be implemented using DEV_RST I2C register which would impact the data traffic. SDC pin and SCL pin are respectively used for I2C Data Input and Clock Input. In another embodiment, a CLK20M pad is used for an optional external 20 MHz clock input to provide an alternative to the VCO clock for one of 2 cases: A) the VCO causes interference, or B) synchronization between a microcontroller and the driver 300 is required.

The dual-channel PAM4 driver 300 is configured to provide output swing of up to 1.5V single-ended and 3.0 Vppd to respectively drive two Mach Zehnder modulators 100 in traveling wave design. S-parameter files, up to 40 GHz, are supplied for the modulator design and the near end wire bond from the driver 300 to the modulator 100. The far end is terminated on-modulator. The far end of the termination resistor is connected to VCC via a wire bond of up to 1 mm length. The trace resistance between the far end of the termination and the VCC pad (such as VCCO, VCCI of the driver 300) is smaller than 0.5 Ohms. The VCC is decoupled to the PCB, using a 270 pF vertical capacitor followed by 100 nF multi-layer capacitor. The VCC pad is triple wire bonded to the decoupling capacitor. The performance of the modulator is dependent on the bias. S-parameter files are also supplied at three voltages (2 end and 1 mid points) to bracket the MZM performance. S-parameter files for typical cases of the wire bond lengths, between 0.5 mm and 1.0 mm, also are supplied.

Additionally, the power supplies may have external decoupling capacitors. The modulator driver design assumes that there will be sufficient decoupling capacitance (>300 pF) on the driver 300 between VCCO, VCCI, Vbias/Vext and GND.

While the above specification is a full description of the specific embodiments, various modifications, alternative constructions and equivalents may be used. Therefore, the above description and illustrations should not be taken as limiting the scope of the present invention which is defined by the appended claims.

What is claimed is:

1. A method of driving a dual-channel modulator in a silicon-photonics communication system, the method comprising:
    coupling the dual-channel modulator with an electrical data interface;
    configuring two differential pairs of inputs per channel respectively to receive two digital differential pair signals from the electrical data interface;
    coupling a Digital-to-Analog Convertor (DAC) per channel to the two differential pairs of inputs to convert the two digital differential pair signals to a single analog differential pair PAM signal at a differential pair output with two single ended swing voltages respectively being outputted to two near ends of two waveguides of a traveling wave modulator associated with the channel and terminated at corresponding two far ends with a pair of matched resistors; and
    configuring a control block including internal voltage/current signal generators to receive control signals from the DAC for providing a dither signal to assist modulation control per channel.

2. The method of claim 1 wherein the configuring the two digital differential inputs per channel comprises configuring a pair of signals to be a most significant bit (MSB) and a least significant bit (LSB) with data rate of 32 Gbps or higher.

3. The method of claim 2 wherein configuring the pair of signals comprises setting the digital differential pair of signals to be a two-level non-return-to-zero (NRZ) bit.

4. The method of claim 1 wherein the single analog differential pair PAM signal comprises 4-level pulse-amplitude-modulation (PAM4) bits.

5. The method of claim 1 further comprising setting each single ended swing voltage to be 1.5V or higher above a bias voltage by the control block resulting in 3V peak-to-peak swing given 30 Ohms to the matched resistor at the far end.

6. The method of claim 1 wherein the traveling wave modulator associated with each channel is independent from the other but is impedance matched for modulating optical signal traveling through the two waveguides.

7. The method of claim 6 further comprising generating a bias voltage of a positive value of less than 2V internally by the control block and outputting the bias voltage via a first pin wire bonded to a second pin to apply to a middle electrode of the modulator for providing a preferred operating point in an amplitude-based modulation of the optical signal.

8. The method of claim 1 wherein the configuring the control block comprises disconnecting the control block from the second pin while the second pin is connected to an external power supply for providing a negative voltage for enlarging a headroom of the single-end swing voltage required for Mach Zehnder modulators.

9. The method of claim 1 further comprising inserting a first stage amplifier in each of the two differential pairs inputs and inserting a second stage amplifier after the DAC and before the differential pair output.

10. The method of claim 1 further comprising forming a SiGe die having a length of 2.55 mm and a width of 1.30 mm.

11. The method of claim 1 further comprising coupling a communication block to a high-speed clock generator to generate the control signals sent via the DAC to the control block and separately to host via a communication interface; and configuring the communication block to provide a variety of internal set points including at least one of: an output swing adjustment ratio per channel, a bias voltage level, or a dither swing voltage per channel.

12. The method of claim 11 wherein each channel is independent from the other and is configured to be shut down individually using the communication interface.

13. The method of claim 11 further comprising generating the dither signal by the control block via two DACs based on control signal from the communication block and outputting the dither signal directly to the analog differential pair signal in radio frequency at the differential pair output.

14. The method of claim 13 wherein the dither signal is a sinusoidal tone of less than 75 mV in amplitude and less than 10 kHz in frequency.

15. The method of claim 11 further comprising providing an externally generated dither signal via the communication block to the control block which applies the dither signal directly to the analog differential pair signal in radio frequency at the differential pair output to control modulator operating point.

16. A method of driving an N-channel modulator in a silicon-photonics communication system, the method comprising:
configuring N channels corresponding to N traveling wave modulators coupled with an electrical data interface, N being an integer equal or greater than 2;
configuring two differential pairs of inputs per channel respectively to receive two digital differential pair signals from the electrical data interface;
coupling a N-bit Digital-to-Analog Convertor (DAC) per channel to the two differential pairs of inputs to convert the two digital differential pair signals to single analog differential pair PAM signal at a differential pair output with two single-end swing voltages respectively outputted to two near ends of two waveguides of a traveling wave modulator associated with the channel and terminated at corresponding two far ends with a pair of matched resistors; and
coupling a control block including internal voltage/current signal generators respectively to each input and the N-bit DAC to receive control signals for providing a dither signal to assist modulation control per channel.

17. The method of claim 16 wherein the configuring two differential pairs of inputs per channel comprises setting the two digital differential pair of signals per channel to be two SLC-like two-level non-return-to-zero (NRZ) bits with data rate of 32 Gbps or higher.

18. The method of claim 16 further comprising configuring the analog differential pair PAM signal to be $2^N$-level pulse-amplitude-modulation (PAM_$2^N$) bits.

19. The method of claim 16 further comprising:
coupling an I2C communication block to a high-speed clock generator to generate the control signals sent via the N-bit DAC to the control block and separately to host via an I2C digital communication interface, and configuring the I2C communication block to provide a variety of internal set points including an output swing adjustment ratio per channel, a bias voltage level, or a dither swing voltage per channel.

20. The method of claim 19 wherein each of the N channels is independent from the other and is configured to be shut down individually using the I2C digital communication interface.

* * * * *